United States Patent [19]

Nishikawa et al.

[11] 4,267,739

[45] May 19, 1981

[54] PUSHBUTTON TUNER

[76] Inventors: Yasuhisa Nishikawa; Takao Kanai, both of 50, Kamitoda, Toda-shi, Saitama-ken, Japan

[21] Appl. No.: 970,329

[22] Filed: Dec. 18, 1978

[30] Foreign Application Priority Data

| Dec. 19, 1977 | [JP] | Japan | 52-169590[U] |
| Dec. 19, 1977 | [JP] | Japan | 52-169591[U] |
| Dec. 22, 1977 | [JP] | Japan | 52-171829[U] |
| Dec. 22, 1977 | [JP] | Japan | 52-171830[U] |
| Dec. 22, 1977 | [JP] | Japan | 52-171831[U] |

[51] Int. Cl.³ .................. H03J 1/08; H03J 5/12
[52] U.S. Cl. .................. 74/10.33; 74/10.85; 192/89 A; 192/93 R; 334/7
[58] Field of Search ............. 74/10.33, 10.85; 334/7; 192/89 A, 93 R

[56] References Cited

U.S. PATENT DOCUMENTS

| 3,946,344 | 3/1976 | Wilkinson | 74/10.33 X |
| 4,161,707 | 7/1979 | Kanai et al. | 74/10.33 X |

*Primary Examiner*—Allan D. Herrmann

[57] ABSTRACT

A flat pushbutton tuner wherein button slide assemblies provided with pushbuttons are disposed in parallel with a base plate of the tuner and mounted directly on said plate without providing a housing or base for the button slide assemblies. The base plate is provided with horizontally extending seats and vertically extending seats formed integrally with said base plate for mounting components of the tuner thereon.

6 Claims, 17 Drawing Figures

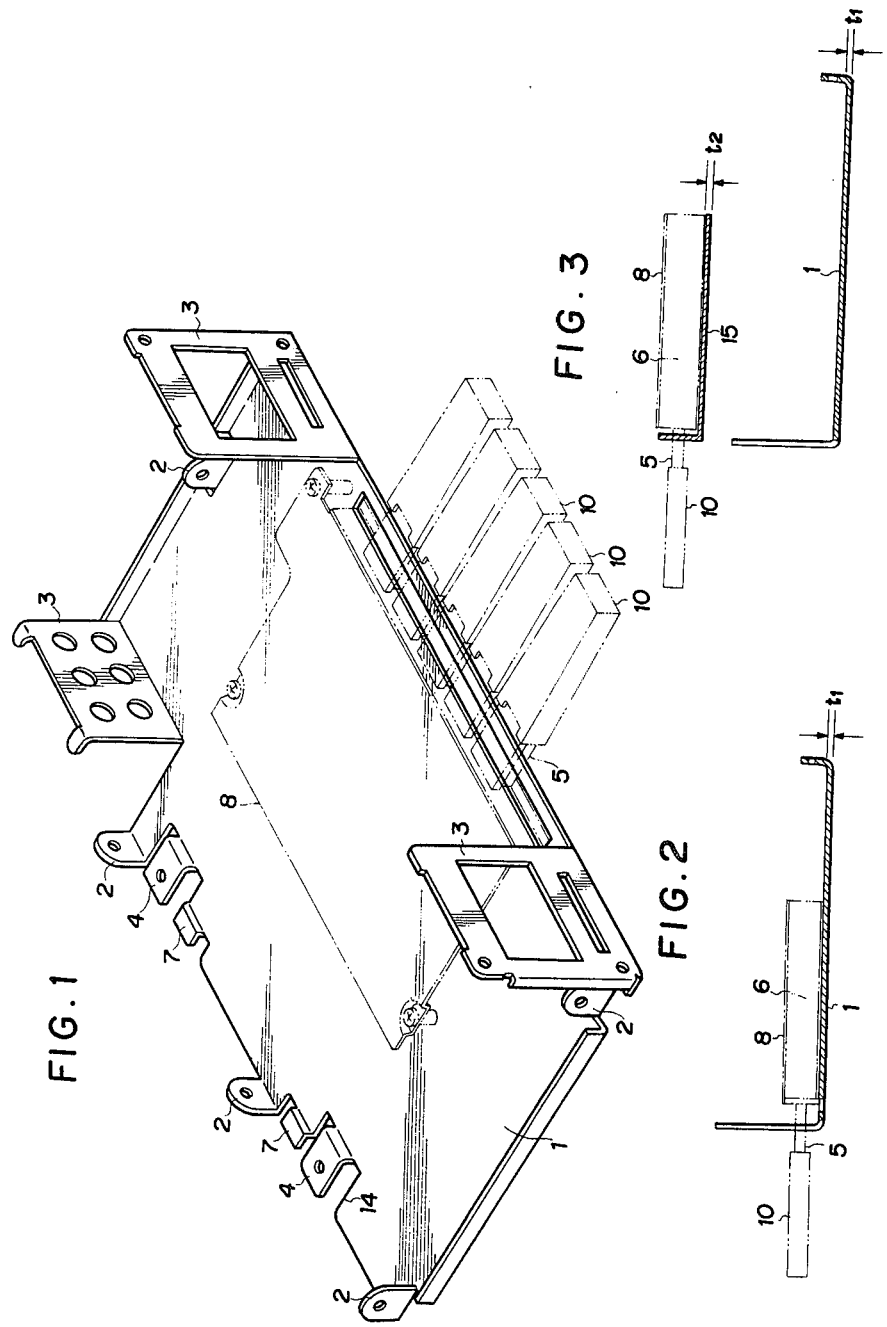

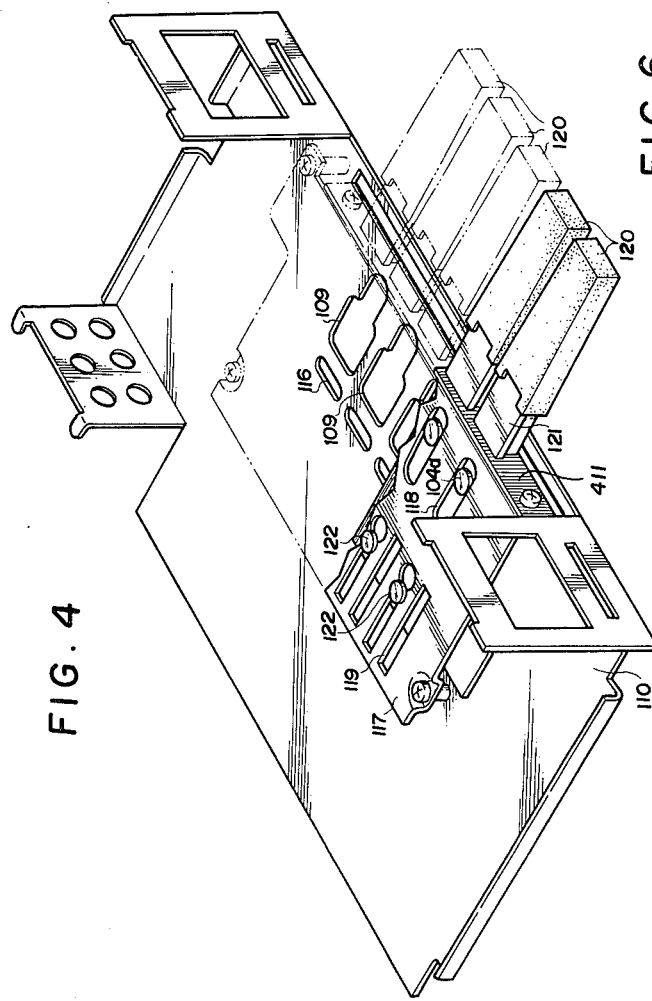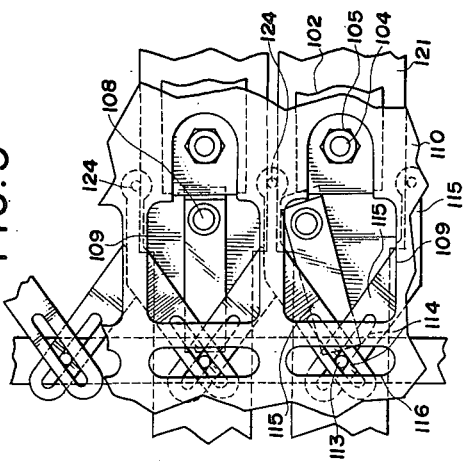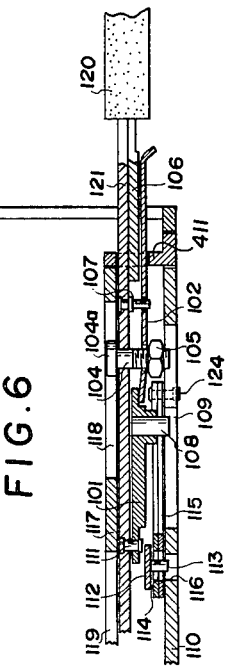

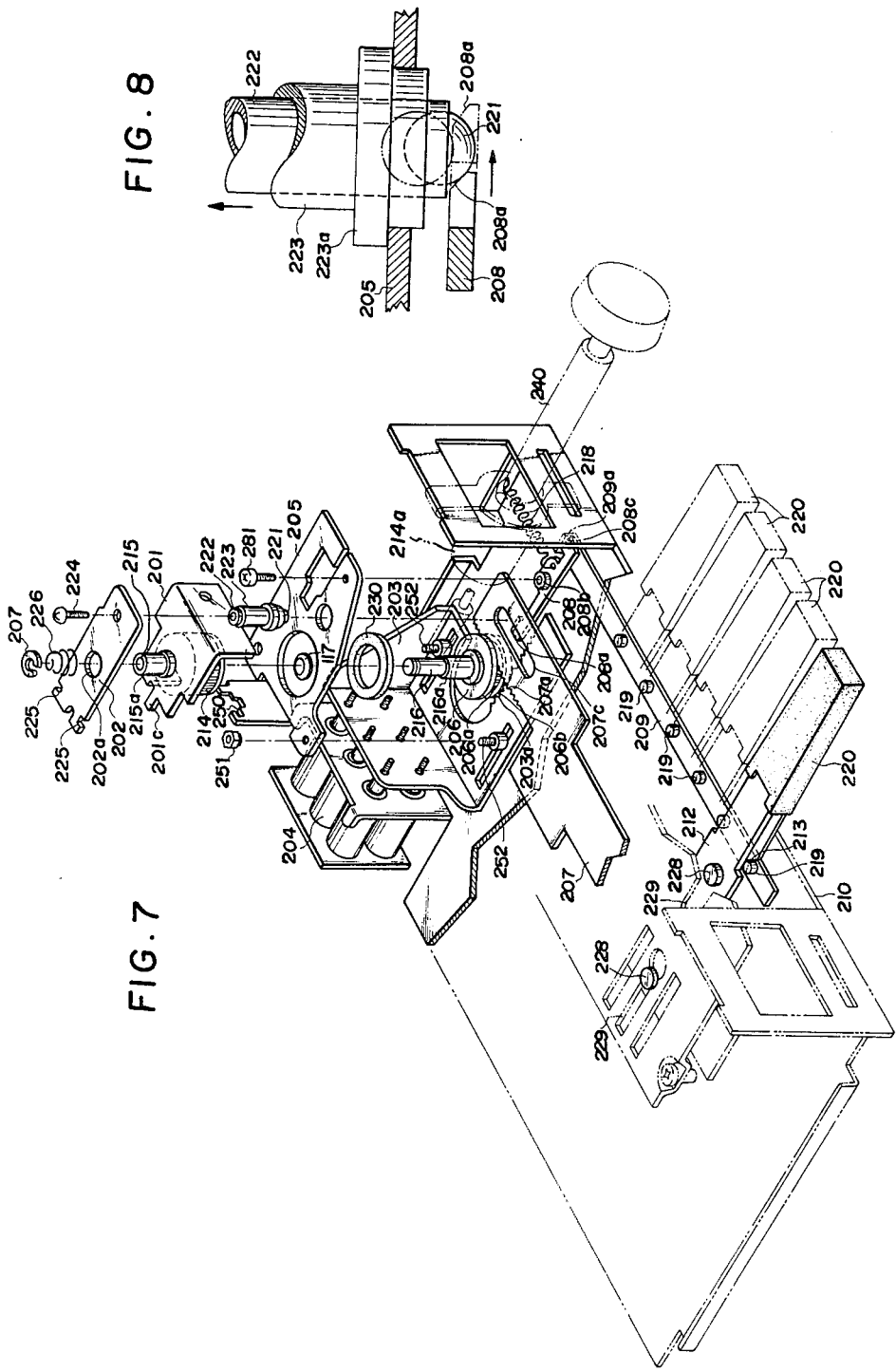

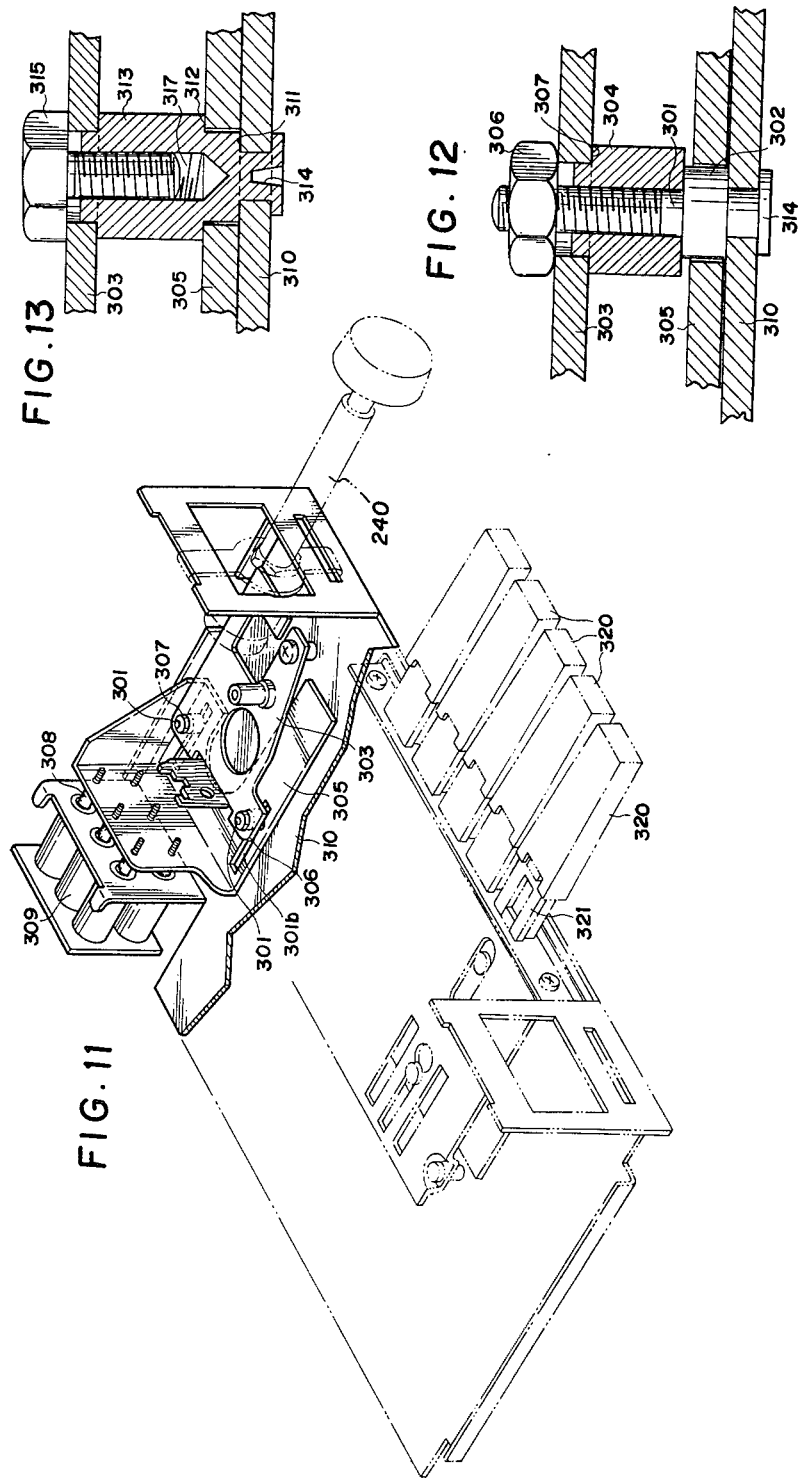

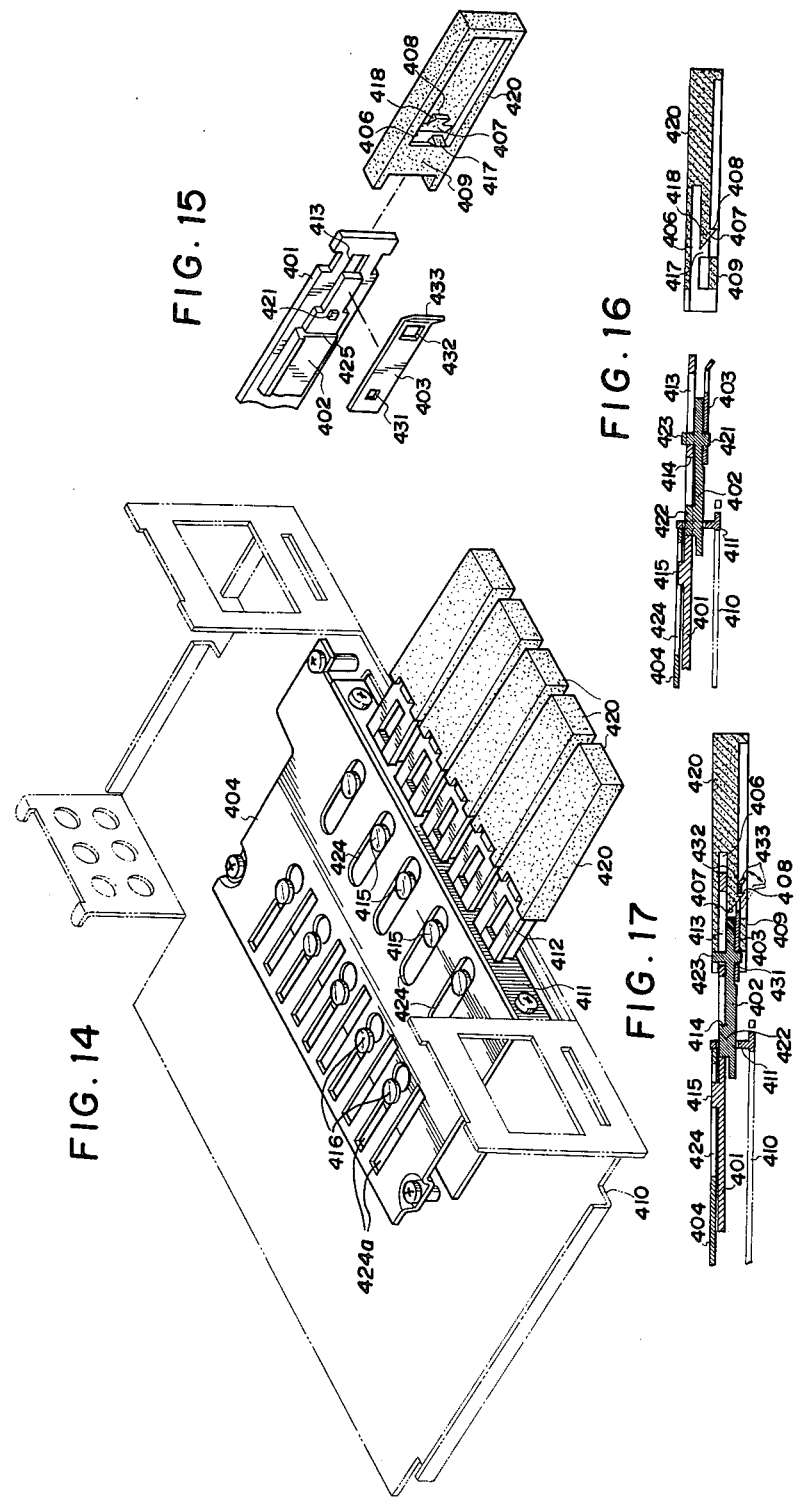

PUSHBUTTON TUNER

BACKGROUND OF THE INVENTION

This invention relates to a pushbutton tuner which is capable of reducing the height or thickness of the tuner and reducing the number of components to be employed.

A pushbutton tuner with reduced overall height or thickness is very advantageous, especially, in case the tuner is assembled with various units, e.g., other components of a radio, to be built in a dashboard of a car. To reduce the height or thickness of the tuner, it has been proposed to dispose button slide assemblies in parallel with a plane of a tuner base plate instead of disposing the assemblies at right angles with the base plate. In fact, this proposal is very effective to reduce the thickness of the tuner especially at a portion where button slide assemblies are mounted. However, a housing for a button slide mechanism which is comprised of a base 15 and an upper plate 8 as depicted in FIG. 3 has been generally employed to attain this structure. More particularly, the button slide mechanism is formed of a plurality of button slide assemblies arranged sideways to form an array of the button slide assemblies. Each of the button slide assemblies includes a button slide and a pushbutton attached thereto. The thus formed button slide mechanism is mounted on the base 15 and the entire assembly is superposed on the base plate 1. The use of two bases 1 and 15 superposed on each other undesirably renders the structure unduly complicated. Furthermore, the thicknesses $t_1$ and $t_2$, the overall height of the tuner and thus make it more bulky than necessary.

SUMMARY OF THE INVENTION

It is therefore an object of the present invention to provide a flat pushbutton tuner which is capable of overcoming the disadvantages of the conventional pushbutton tuner described above.

In accordance with the present invention, there is provided a pushbutton tuner comprising: a base plate; a button slide mechanism including a plurality of button slide assemblies disposed in parallel with the base plate, each of said button slide assemblies being comprised of a button slide, a frequency control member, a locking member to lock the frequency control member in a given position, a pin provided on the frequency control member for station selection operation, a threaded shaft, a nut in mesh with the threaded shaft to hold the locking member intermediate thereof; and an upper plate for covering said button slide mechanism, said button slide mechanism being mounted directly on said base.

BRIEF DESCRIPTION OF THE DRAWINGS

FIG. 1 is a perspective view of a base plate of a pushbutton tuner in accordance with the present invention.

FIG. 2 is a diagrammatic sectional view of a button slide mechanism mounted on the base plate in accordance with the present invention.

FIG. 3 is a similar view of a base plate and a button slide mechanism of a conventional technique.

FIG. 4 is a partly cut-away perspective view of the pushbutton tuner in accordance with the present invention, showing a structure of its principal portion.

FIG. 5 is a fragmentary bottom view of the pushbutton tuner shown in FIG. 4.

FIG. 6 is a fragmentary sectional view of the pushbutton tuner shown in FIG. 4.

FIG. 7 is a partly cut-away exploded view of the pushbutton tuner in accordance with the present invention, showing its clutch mechanism and components associated therewith.

FIG. 8 is an enlarged sectional view of an operating portion of an operating cylindrical shaft shown in FIG. 7.

FIG. 11 is a persepective view of the pushbutton tuner in accordance with the present invention, showing its auxiliary base plate fixing structure.

FIG. 12 is an enlarged sectional view of the auxiliary base plate fixing portion shown in FIG. 11.

FIG. 13 is a similar enlarged sectional view of a corresponding auxiliary base fixing portion of a conventional technique.

FIG. 14 is a perspective view of a preferred form of a button slide mechanism in accordance with the present invention, which employs a structure for removably fixing a pushbutton knob.

FIG. 15 is a fragmentary emploded perspective view of the removable pushbutton attaching structure shown in FIG. 14.

FIG. 16 is a fragmentary sectional view of the components of said removable pushbutton attaching structure, shown in a position just before assembled.

FIG. 17 is a fragmentary sectional view of the components of the removable pushbutton attaching structure, shown in an assembled state.

PREFERRED EMBODIMENTS OF THE PRESENT INVENTION

Figure 9:
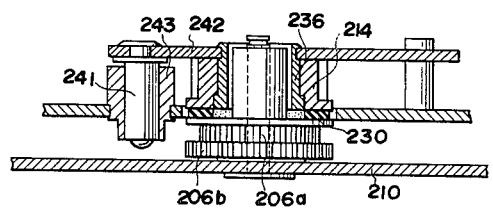
FIG. 9 is a sectional view of a conventional clutch mechanism.

Referring now to FIG. 1, there is illustrated a pushbutton tuner in accordance with the present invention. A conventional base plate having vertical or upright seats 2 for securing cover members etc. may be employed in this invention. However, a button slide mechanism comprising button slide assemblies and pushbuttons is mounted directly on the base plate 1 as shown in FIG. 2 without using a button slide mechanism housing or base. An upper plate is provided over the button slide mechanism so that other components may be superposed theron. The base plate 1 preferably has, at its rear portion, cutouts 14 and horizontally extending seats 4 and supports 7 formed integrally with the base plate 1 at given heights. These seats 4 and the supports 7 are adapted to mount thereon components and devices associated with the tuner. Relatively large vertically extending seats 3 are formed integrally with the base plate 1 for mounting a control shaft and a coil housing thereto.

In accordance with the present invention, such a button slide mechanism housing or base as shown by 15 is eliminated, and accordingly a step for fitting such a housing or base 15 on the base plate 1 is also eliminated. Thus, the fabricating of the pushbutton tuner can be facilitated and the height of the tuner can be minimized by reducing the thickness of the tuner corresponding by the thickness $t_2$ of the button slide mechanism housing or base 15. Further, various components such as radiating plates for band selector switches or power transistors, which are conventionally attached to the button slide mechanism housing or base 15, can be stably and positively fixed by forming the seats 4 extending horizontally at an appropriate height from the base plate 1.

The flat pushbutton tuner of the present invention may preferably employ an improved base plate structure to further reduce the height or thickness of the tuner. Generally, in a pushbutton tuner with button slide assemblies disposed in parallel with a base plate, frequency control members attached to respective button slides, locking members etc. are connected by threaded shafts and nuts and the entire assemblies are disposed on a flat surface of the base plate. In this structure, however, sufficient spacing from said surface of the base plate 1 is required to allow the ends of the shafts and the nuts to pass therethrough when the button slide assemblies are pressed forwardly. In this connection, it is to be noted that the shaft and nut should have minimum length and thickness, respectively, determined by the entire structure of the tuner and such length and thickness cannot be reduced to less than the given minimum values. Thus, the reduction in thickness of the pushbutton tuner is inevitably limited in such a structure. On the other hand, the thickness of the pushbutton tuner demanded in the field is now reduced to the order of 10 mm or less. It will then be appreciated that reduction in thickness as small as 1 or 2 mm has significance.

A preferred form of a pushbutton tuner in accordance with the present invention employs a modified base plate as shown in FIGS. 4 to 6. A plurality of button slides 121 with push buttons 120 attached thereto, respectively, are disposed in parallel with a base plate 110 as in a conventional pushbutton tuner. To each of the button slides 121 a frequency control member 101 is pivotably connected by a pin 111 and a resilient locking member 102 for locking said frequency control member 101 is also attached. The locking member 102 is supported intermediate the ends thereof by a pin 107 as depicted in FIG. 6 and fixed at a portion behind the pin 107 by a threaded shaft 104 carried on the button slide 121 and a nut 105 meshable with said shaft 104. A slide member 106 adapted to slide conjointly with the pushbutton 120 along the button slide 121 is provided at a base portion of the locking member 102. By pulling out the pushbutton 120 and the slide member 106 with it, the setting of the frequency control member 101 is released from the associated locking member 102, to enable the change of the set angle of the frequency control member 101. When the pushbutton 120 is pushed in all the way the angle of the frequency control member 101 is first set and then re-locked by the member 102 as it reaches its fully depressed position. In accordance with the present embodiment, an opening 109 is formed in the base plate 110 at an area covering the actuation locci of the shaft 104, the nut 105 and a pin 108 provided on the frequency control member 101.

In the embodiment as shown, each of the pins 108 is adapted to be brought into contact with the crotch between a pair of crossing link members 115 pivoted on spaced pivot pins 124 and which are arranged such that elongated slots 114 thereof cross each other and receive a pin 113 carried on a transversely extending and movable memory slide 112. Station selection is carried out in a conventional manner when the pushbutton is pushed forwardly or depressed to bring the associated locked pin 108 against the crossing pair of link members 115 where the members pivot until the locked pin 108 is located in the crotch of the crossing link members. For the pin 113, an elongated opening 16 is also formed in the base plate 110 covering the actuation locus thereof. An upper plate 117 is provided over the array of the button slide assembly as shown in FIG. 4. Guide slots 118 and 119 are formed on the upper slide 117 for receiving therein and guiding therealong a head. 104a of the shaft 104 and a guide pin 122 provided on the button slide 121 at its rear portion.

In accordance with this arrangement, since the shaft 104, nut 105 and pin 108 are received in the opening 109 formed in the base plate 110, the overall height of the pushbutton tuner can be reduced as much as a thickness corresponding to the thickness of the base plate 110. It is to be noted that this structure will never prevent the operation of the button slide assemblies nor spoil the dust-tightness of the tuner because the base plate 110 formed with the openings 109 is a bottom plate of the tuner and positioned under the button slide assemblies.

In a preferred mode of the pushbutton tuner, an improvement is also proposed for clutch mechanism employing a worm and a worm gear which clutch mechanism decouples the manual tuning shaft 240 (FIG. 7) from the memory slide 112 in a conventional way when a pushbutton 120 is depressed. Generally, a conventional clutch mechanism of this type as shown in FIG. 9 is so constructed that a cylindrical shaft 236 provided on a worm gear 214 being secured to an operating plate 242 intermediate the ends thereof, said operating plate 242 is fixed at one end thereof to a up-and-down shaft 241 actuatable by a clutch lever. The up-and-down shaft 241 is guided by a sleeve 243. This structure, however, has a disadvantage that a clutch operating force is locally applied at an end portion of the operating plate 242 and the contact between the worm gear 214 and a friction member 230 is likely to be non-uniform so that a slip may possibly be caused and accurate and proper clutch operation cannot be assured.

Figure 10:
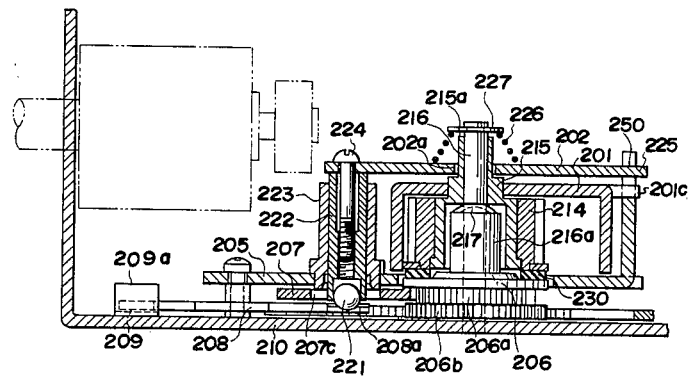
FIG. 10 is a similar sectional view of the clutch mechanism in accordance with the present invention, shown in its assembled state.

The improved clutch mechanism in accordance with the present embodiment is shown in FIG. 7. A plurality of button slide assemblies 212 as described each having a pushbutton attached thereto are arranged sidewise along the base plate 210. Each of the button slide assemblies 212 is provided with a cammed portion 213 at its one side end portion. When any one of the button slide assemblies 212 is pushed forwardly upon depression of the pushbutton 220, while being guided through engagement of pins 228, 228 with guide slots 229, 229, the cammed portion 213 is brought into contact with a projection 219 on a slide member 209 for clutch operation to displace said slide member 209 in the leftward direction in FIG. 7 against the action of a spring 218. Theslide member 209 has at its one end an engaging portion 209a. A clutch lever 208 is pivotably supported at 208 on the base plate 210 intermediate the ends thereof and has at one end a receiving portion 208c and at another end an operating portion 208a. The receiving portion 208c of the clutch lver 208 is adapted to abut on said engaging portion 209a of the slide member 209. The operating portion 208a is adapted to be in contact with a ball 221 (FIG. 10) provided at the lowermost position of a cylindrical shaft 222 as will be mentioned later. A worm gear 214 meshable with a worm 214a (FIG. 7) adapted to rotate upon the operation of manual rotary shaft 240 is fixed to a frame member 201. The worm gear 214 is placed on a rotary disc member 206 rotatably mounted on the base plate 210 interposing the friction member 230. As shown in FIG. 10, gears 206a, 206b are formed integrally with the rotary disc member 206. A stepped shaft comprising shaft portions 216, 216a is provided at a central portion of the rotary disc member 206. The gear 206a is meshable with a rack 207a (FIG. 7) of a memory slide 207 disposed sideways at a central portion of the base plate 210. The memory slide 207 like the memory slide 112 previously described is adapted to be displaced according to the set angle of the frequency control member as determined by a button depressed slide assembly, to rotate the rotary disc member 206. The gear 206b is meshable with the teeth 203a of a movable member 203 disposed under said memory slide 207 in a direction normal thereto. Thus, it will be appreciated that upon the displacement of the memory slide 207, the movable member 203 is also actuated to displace cores with respect to a coil housing 204. A cylindrical shaft member 215 disposed in the worm gear 214 is concentrically fitted around the shaft portions 216, 216a. The cylindrical shaft member 215 having a portion 215a of reduced diameter is inserted into an opening 202a formed centrally in a pressure plate 202. The pressure plate 202 has an end secured to the cylindrical shaft 222 by a screw. At the central portion of the pressure plate 202 where said opening 202a is formed for receiving the reduced portion 215a of the cylindrical shaft member 215, a spring member 226 is interposed between an E-ring fixed to the top end of the shaft portion 216 and the pressure plate 202. The plate 202 has another end portion formed with engaging cutouts 225 on its opposite sides. The engaging cutouts 225 are engaged with a receiving member 250 of a plate 205. The plate 205 is fixed on the base plate 210 by means of a threaded shaft 252 acting also as a guide pin of the movable member 203 and a nut 251.

Between the shaft portion 216a and the cylindrical shaft 215 is interposed a resilient washer 217 as shown in FIG. 7. A frame member 201 has a projection 201c which is adapted to be supported on the lower end of the receiving portion 250 as shown in FIG. 10.

In such a construction, it will be seen that when the pushbutton 220 is depressed to displace the slide member 209, the receiving portion 208c of the clutch lever 208 is actuated and accordingly the clutch lever 208 is rotated around 208b. The operating portion 208a of the lever 208 is then pushed into under the roller 221 so that the cylindrical shaft 222 is raised to move the end portion of the pressure plate 202 upwardly against the action of the spring 226. It will then be appreciated that the bottom of the worm gear 214 normally pressed against the friction plate 230 on the rotary disc member 206 is released by the action of the resilient member 217 to effect a clutch de-coupling operation. Thus, the station selection through one-touch operation can be achieved. On the other hand, in a normal state where the worm gear 214 is pressed against the friction plate 230 by the action of the spring 226, a manual fine tuning operation can be attained by rotating the manual rotary shaft 240 associated with the worm gear 214.

In a preferred form of a pushbutton tuner in accordance with the present invention, an improved structure for disposing components associated with clutch and core mechanisms superposedly on each other may be employed to reduce the height of the tuner without deteriorating the strength of the structure.

In a pushbutton tuner, a core slide slidable with respect to a base plate of the tuner is provided for tuning by both pushbutton operation and manual operation of a rotary shaft, and various mechanisms such as a clutch mechanism for changeover between the pushbutton operation and the manual operation is superposed on such a core slide to reduce the overall size of the tuner. To this end, it is common to employ an auxiliary base on which the clutch mechanism etc. is mounted. One example of a conventional pushbutton tuner having an auxiliary base is shown in FIG. 13. A fitting member 313 having stepped portions 311, 312 is fitted to a base plate 310 by caulking 314 provided on the bottom surface of the base 310. The fitting member 313 is supported at the step 311 on the base plate 310 and adapted to slidably receive core slides 305 in the stepped portion 312. The fitting member 313 has a threaded groove 317, and an auxiliary base 303 is fixed to the fitting member 313 by means of a screw 315 meshable with the groove 317. In this structure, however, the fitting member 313 cannot be long enough, especially when the intended pushbutton tuner is of a flat type, and the threaded groove 317 is generally formed much deeper than the stepped portion 312. Accordingly, the strength of a portion of the fitting member lower than the step 312 is deteriorated and the member 313 may possibly be broken at the portion when subjected to caulking. In addition, since the caulking is carried out after the core slide 305 has been assembled, not only the shaft portion of the member 313 but also the stepped portion 311 is likely to be deformed. Thus, smooth sliding of the core slide 305 will be prevented, causing troubles in product control.

In order to overcome the defects and disadvantges of the conventional technique as mentioned above, the structure as shown in FIG. 11 is proposed in relation with the present invention. A core slide 305 is slidably mounted on the base plate 310 by means of an elongated slot 316. An array of button slide assemblies is disposed on the base plate as in the foregoing embodiment. Cores 308 are provided on the core slide 305 so as to displace with respect to a coil housing 309. In the thus formed arrangement, the invention employs a structure for fixing an auxiliary base 303 as shown in FIG. 12. A threaded shaft 301 with a flange formed intermediate thereof is fixed to the base plate 310 by caulking 314. The flange 302 is so formed as to allow free slide of the core slide 305. A sleeve 304 having a shoulder 307 at its upper end is fitted around the threaded shaft 301. The auxiliary base 303 is mounted on the sleeve 304, and a nut 306 is meshed with the threaded shaft 301 to fixedly support the auxiliary base 303 on the sleeve 304.

In accordance with this improvement, not only the core slide 305 can be slidably provided but the auxiliary base 303 is positively superposed thereon. In addition, this structure has no such groove as will deteriorate the strength of the fitting member. On the contrary, the threaded shaft 301 has a flange 302 to reinforce the lower portion of the member corresponding to the fitting member.

In a further preferred form of the pushbutton tuner in accordance with the present invention, an improvement is also made in a pushbutton knob.

Generally in a pushbutton tuner, a slidable member is to be slidably provided to a button slide disposed on a base plate. Further, the pushbutton knob should be in a fixed relation at least with the slidable member and slidable with respect to the button slide to release the locking of a frequency control member. A stable pushbutton knob pushing operation should also be assured. Due to these requirements, the fitting mechanism of the pushbutton knob must be considerably complicated and special tools and equipments are necessitated to surely fix the knob to the slidable member, for example, by caulking. Further, once the knob is fixed to the slidable member, the knob cannot be removed unless the caulking is undone. Accordingly, a knob attaching step should be carried out at a time determined depending upon operational conveniences of other steps for mounting the button slide mechanism on the base plate. Thus, the sequence of the tuner fabrication cannot be arbitrarily changed. In addition, the knob attaching operation itself is not easy. Therefore, the pushbutton knobs cannot be freely exchanged according to tastes of the users. The pushbutton knob thus fixed projects from the housing of the tuner and is not only very inconvenient for conveyance or transport of the tuner but likely to be damaged. Even if the knob is fixed again by using the tools as mentioned above in an attempt to repair the damage, delicate plays afforded between the button slide, the slidable member and the pushbutton knob cannot be reproduced accurately. Therefore, disarrangement of the pushbuttons may possibly be caused. In fact, it is very difficult to recover the originally assembled state through such a repairment by redoing of the caulking. A possible breakage of the knob attaching portion may further caused by such a repairment.

In the improved pushbutton knob structure according to the present invention, the defects and disadvantages of the prior art can be eliminated. Referring now to FIG. 14, a plurality of button slides 401 with pushbutton knobs 420 attached thereto, respectively, are arranged sideways on a base plate 410. In the so constructed pushbutton tuner, the attachment of the pushbutton knob is made in a manner as shown in FIGS. 15 to 17. The knob attachment structure is formed of a slidable member 402 fitted to the base portion of the button slide 401 and a resilient member 403 fitted to the slidable member 402. The resilient member 403 has first and second openings 431, 432 and a guide 433. The button slide 401 has elongated slots 413, 414 (FIG. 17) which are adapted to receive projections 422, 423 formed on one side of the slidable member 402, respectively, to allow the slidable member 402 to move within a limited distance. The button slide 401 has projections 415, 416 engageable with guide slots 424, 424a in an upper plate 404 fixed to the base plate 410 as shown in FIG. 14. The slidable member 402 has another projection 421 (FIG. 16) on its other side opposite to the projections 422, 423. A shoulder 425 (FIG. 19) is further provided on the slidable member 402 for positioning the tip end of the resilient member 403. The projection 421 is fitted around the first slot 431 of the resilient member 403. The pushbutton knob 420 is formed with a hole 406 for receiving therein the bottom portion of the button slide as depicted in FIGS. 16 and 17. A wall 409 is formed centrally in the hole 406 and integrally with the knob 420. In an interior portion of the hole 406, a hook portion 418 of an arrow in section having a sloped face 407 and a shoulder 408 is formed integrally with the knob 420. The hook portion 418 is disengageably fitted in the second slot 432 of the resilient member 403. The button slide assemblies are surely and accurately mounted on the base plate 410 using a fitting plate 411 with openings adapted for receiving the respective button slide assemblies.

Thus, it will be seen that the slidable member 402 is slidably fitted to the base end portion of the button slide 401 and the resilient member 403 is fitted to said slidable member 402 through an engagement of the projection 421 with the slot 431 to realize the state as shown in FIG. 16. In the position of FIG. 16, the assembly is inserted into the hole 406 of the pushbutton knob 420 to attain the fixing of the knob 420. Stated illustratively, through such insertion, the guide 433 formed at the base end of the resilient member 403 is guided by the sloped face 407 while being bent as shown by a phantom line in FIG. 17. The base end of the opening 432 is then brought into contact with the shoulder 408 and the hook portion 432 is automatically locked in the opening 432. Thus, the fixing can be accomplished by one-touch operation. In this connection, it will be seen from FIG. 17 that the knob 420 and the slidable member 402 is kept in a firmly fixed relation through the resilient member 403 thereby to allow conjoint slide in their longitudinal direction. It can also be seen that the button slide 401 is held stably. In addition, the assembly can easily be disassembled by pulling the base end portion of the resilient member 403 to the position as shown by the phantom line in FIG. 17.

In accordance with this improvement, since the pushbutton knob 420 can be removably attached to the button slide, the order of the knob fixing step is by no means specified in relation with the mounting operation of the button slide assemblies on the base plate 410 and the knob can be freely fixed or removed according to necessity. Thus, the fabrication of the tuner unit is much facilitated. Though the knob can be freely fixed or removed whenever desired, the components are not subject to any deformation or damage by such fixing or removal operation. Thus, a stable fixation of the knob in a final product is assured and possible disarrangement of the knobs etc. can be eliminated. Besides, tuners with variety of pushbutton knobs can be easily obtained in response to various tastes of the users. Furthermore, for conveyance or transport or packaging, the knobs may be removed to facilitate the operation therefor.

We claim:
1. A pushbutton tuner comprising:
   a base plate;
   a button slide mechanism including
      a plurality of button slide assemblies disposed in parallel with the base plate,
      each of said button slide assemblies being comprised of a button slide, a frequency control member, a locking member to lock the frequency control member in a given position, a pin provided on the frequency control member for station selection operation, a threaded shaft, a nut in mesh with the threaded shaft to hold the locking member intermediate thereof; and
   an upper plate for covering said button slide mechanism; said button slide mechanism being mounted directly on said base.

2. A pushbutton tuner of claim 1 including a mechanism for removably fitting a pushbutton knob which comprises:
   a slidable member fitted to the button slide at its base end and adapted to be slidable within a limited length with respect to said button slide;
   said slidable member being provided with a projection;
   a resilient member having first and second openings, said first opening being adapted to receive said projection therein;
   a pushbotton knob fitted to said base end of the button slide and formed with a hole for receiving said base end of the button slide, slidable member and resilient member therein;

said pushbutton knob being provided with a hook formed of a sloped face and a shoulder interiorly of an opening communicating with said hole of the knob;

said hook being adapted to be locked in said second opening of the resilient member.

3. A pushbutton tuner of claim 1, wherein vertically extending seats and horizontally extending seats for mounting tuner components thereon are formed integrally with said base plate.

4. A pushbutton tuner of claim 1, wherein a plurality of openings are formed in the base plate to freely receive said pin for station selection operation, threaded shaft and nuts therein, covering the locuci of their respective actuation.

5. A pushbutton tuner of claim 1 including a clutch mechanism which comprises:
- a worm;
- a worm gear in mesh with said worm;
- a friction member;
- a shaft assembly fitted with said worm gear and friction member;
- a frame member to which said worm gear is fixed;
- a pressure member supported at its one end by said frame member and movably fitted at its central portion around said shaft assembly;
- a clutch lever adapted to be operated in response to actuation of the button slide;
- a cylindrical shaft connected to said pressure member at its another end so as to move up and down by said clutch lever; and
- a spring member interposed between said shaft assembly and pressure member;

thereby to uniformly apply the spring force of said spring member to said worm gear and friction member.

6. A pushbutton tuner of claim 1 including an auxiliary base plate mounting structure which comprises:
- a slide member slidably mounted on the base plate;
- a threaded shaft fixed to the base plate and having a flange intermediate thereof;
- a nut in mesh with said threaded shaft;
- a sleeve fitted around said threaded shaft; and
- an auxiliary base plate fixed by threaded shaft and nut and supported through said sleeve to be superposed on said slide member.

* * * * *